(12) United States Patent
Song et al.

(10) Patent No.: US 8,324,051 B2
(45) Date of Patent: Dec. 4, 2012

(54) METHODS OF MANUFACTURING NOR-TYPE NONVOLATILE MEMORY DEVICES INCLUDING IMPURITY EXPANSION REGIONS

(75) Inventors: Young-Soo Song, Incheon (KR); Joong-Shik Shin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 366 days.

(21) Appl. No.: 12/792,508

(22) Filed: Jun. 2, 2010

(65) Prior Publication Data

US 2011/0177661 A1    Jul. 21, 2011

(30) Foreign Application Priority Data

Jan. 20, 2010   (KR) .................. 10-2010-0005332

(51) Int. Cl.
*H01L 21/336* (2006.01)
(52) U.S. Cl. ........ 438/257; 438/259; 438/261; 438/264; 438/287; 257/316; 257/321; 257/900; 257/E21.422; 257/E21.423
(58) Field of Classification Search .................. None
See application file for complete search history.

(56) References Cited

U.S. PATENT DOCUMENTS

| | | | |
|---|---|---|---|
| 5,394,001 A | | 2/1995 | Yamaguchi et al. |
| 5,559,048 A * | | 9/1996 | Inoue .................. 438/257 |
| 6,621,119 B1 * | | 9/2003 | Wu ...................... 257/321 |
| 7,344,923 B2 * | | 3/2008 | Hofmann et al. ....... 438/128 |
| 7,384,845 B2 | | 6/2008 | Lee |
| 2005/0037572 A1 | | 2/2005 | Lee |

FOREIGN PATENT DOCUMENTS

| | | |
|---|---|---|
| JP | 5-326979 A | 12/1993 |
| JP | 11-145430 A | 5/1999 |
| KR | 2003-0094442 A | 12/2003 |
| KR | 10-2005-0017485 A | 2/2005 |

\* cited by examiner

*Primary Examiner* — Zandra Smith
*Assistant Examiner* — Khanh Duong
(74) *Attorney, Agent, or Firm* — Myers Bigel Sibley & Sajovec, P.A.

(57) ABSTRACT

Methods of manufacturing NOR-type flash memory device include forming a tunnel oxide layer on a substrate, forming a first conductive layer on the tunnel oxide layer, forming first mask patterns parallel to one another on the first conductive layer in a y direction of the substrate, and selectively removing the first conductive layer and the tunnel oxide layer using the first mask patterns as an etch mask. Thus, first conductive patterns and tunnel oxide patterns are formed, and first trenches are formed to expose the surface of the substrate between the first conductive patterns and the tunnel oxide patterns. A photoresist pattern is formed to open at least one of the first trenches, and impurity ions are implanted using the photoresist pattern as a first ion implantation mask to form an impurity region extending in a y direction of the substrate. The photoresist pattern is removed. The substrate is annealed to diffuse the impurity region, thereby forming an impurity expansion region further expanding in an x direction of the substrate. The substrate is selectively removed using the first mask patterns as an etch mask to form second trenches corresponding to the first trenches. Isolation layers are formed to define active regions in the second trenches.

20 Claims, 14 Drawing Sheets

METHODS OF MANUFACTURING NOR-TYPE NONVOLATILE MEMORY DEVICES INCLUDING IMPURITY EXPANSION REGIONS

CROSS-REFERENCE TO RELATED APPLICATION

This application claims the benefit of Korean Patent Application No. 10-2010-0005332, filed Jan. 20, 2010, the contents of which are hereby incorporated herein by reference in their entirety.

BACKGROUND

1. Field

Example embodiments relate to methods of manufacturing NOR-type flash memory devices.

2. Description of Related Art

Even if power supply is abruptly interrupted, a flash memory device may retain stored data. Also, a NOR-type flash memory device may be capable of independently controlling memory cells to increase operation speed.

SUMMARY

Example embodiments can provide methods of manufacturing NOR-type flash memory devices in which a drain metal contact and a source metal contact are regularly arrayed in a straight line.

The technical objectives of the inventive disclosure are not limited to the above disclosure; other objectives may become apparent to those of ordinary skill in the art based on the following description.

According to example embodiments, a method of manufacturing a NOR-type flash memory device includes forming a tunnel oxide layer on a substrate. A first conductive layer is formed on the tunnel oxide layer. First mask patterns are formed parallel to one another on the first conductive layer in a y direction of the substrate. The first conductive layer and the tunnel oxide layer may be selectively removed using the first mask patterns as an etch mask. Thus, first conductive patterns and tunnel oxide patterns are formed, and first trenches are formed to expose the surface of the substrate between the first conductive patterns and the tunnel oxide patterns. A second mask pattern, such as a photoresist pattern, is formed to open at least one of the first trenches. Impurity ions are implanted using the second mask pattern as a first ion implantation mask, thereby forming an impurity region extending in the y direction of the substrate. The second mask pattern is removed. The substrate is annealed to diffuse the impurity region, thereby forming an impurity expansion region further expanding in an x direction of the substrate. The substrate is selectively removed using the first mask patterns as an etch mask to form second trenches corresponding to the first trenches. Isolation layers are formed to define active regions in the second trenches.

According to other example embodiments, a method of manufacturing a NOR-type flash memory device includes forming first mask patterns as line-and-space (L/S) types on a substrate having a first conductive layer. The first conductive layer is etched using the first mask patterns as an etch mask to form first trenches defining first conductive patterns. A second mask pattern, such as a photoresist pattern, is formed to open at least one of the first trenches. First impurity ions are implanted into the substrate using the second mask pattern as an ion implantation mask. The first impurity ions are diffused using an annealing process to form an impurity expansion region. The substrate is etched using the first mask patterns as an etch mask, thereby forming second trenches defining active regions. Thus, the impurity expansion region is separated into at least two regions by the second trench. Isolation layers are formed in the second trenches. A gate dielectric layer and a second conductive layer are deposited on the first conductive patterns. Third mask patterns, such as second hard mask patterns, are patterned as L/S types in an orthogonal direction to the first mask patterns. The second conductive layer and the gate dielectric layer are etched using the third mask patterns as an etch mask, thereby forming first conductive patterns, gate dielectric patterns, and second conductive patterns. Second impurity ions are implanted using the third mask patterns as an ion implantation mask, thereby forming common source regions on one side of the second conductive patterns and forming drain regions on the other side of the second conductive patterns. The third mask patterns are removed, an interlayer insulating layer is deposited on the second conductive patterns, and drain metal contacts and source metal contacts are vertically formed in portions of the interlayer insulating layer corresponding to the drain regions.

According to still other example embodiments, a method of manufacturing a NOR-flash memory device includes forming first mask patterns as L/S types on a substrate on which a first polysilicon (poly-Si) layer is stacked. Line-type first mask patterns correspond to active regions to be formed on the substrate, and space-type first mask patterns correspond to isolation layers to be formed on the substrate. The first poly-Si layer is etched using the first mask patterns as an etch mask until the substrate is exposed, thereby forming first poly-Si patterns defined by first trenches. A second mask pattern, such as a photoresist pattern, is formed to open one or two of the first trenches. Impurity ions are implanted into a region of the substrate exposed by the one or two first trenches using the second mask pattern, thereby forming an impurity region in the exposed region of the substrate. The substrate is annealed at a predetermined temperature to diffuse the impurity region from the exposed region of the substrate to an unexposed region thereof, thereby forming an impurity expansion region expanding to the active regions of the substrate. The substrate is etched to a predetermined depth using the first mask patterns, thereby forming second trenches extending downward from the first trenches. The second trenches separate the impurity expansion region into two or three regions. The isolation layers are formed to fill at least the second trenches and isolate the active regions from the first conductive patterns. An oxide-nitride-oxide (ONO) pattern and a second poly-Si pattern are formed to extend in an orthogonal direction to the first poly-Si pattern. Common source regions are continuously formed on one side of the second poly-Si patterns in the direction in which the second poly-Si patterns extend, and drain regions are discontinuously formed on the other side of the second poly-Si patterns in the direction in which the second poly-Si patterns extend. Drain metal contacts and source metal contacts are repetitively aligned in the drain regions. The common source regions are electrically connected to the source metal contacts of the drain regions by the impurity expansion region that run under the first poly-Si layer.

BRIEF DESCRIPTION OF THE DRAWINGS

Example embodiments are described in further detail below with reference to the accompanying drawings. It should be understood that various aspects of the drawings may have been exaggerated for clarity.

FIGS. 3A through 12A are longitudinal sectional views taken along line A-A' of FIG. 1, which illustrate a method of manufacturing a NOR-type flash memory device according to example embodiments.

FIGS. 3B through 12B are longitudinal sectional views taken along line B-B' of FIG. 1, which illustrate a method of manufacturing a NOR-type flash memory device according to example embodiments.

DETAILED DESCRIPTION OF THE EMBODIMENTS

Figure 1:
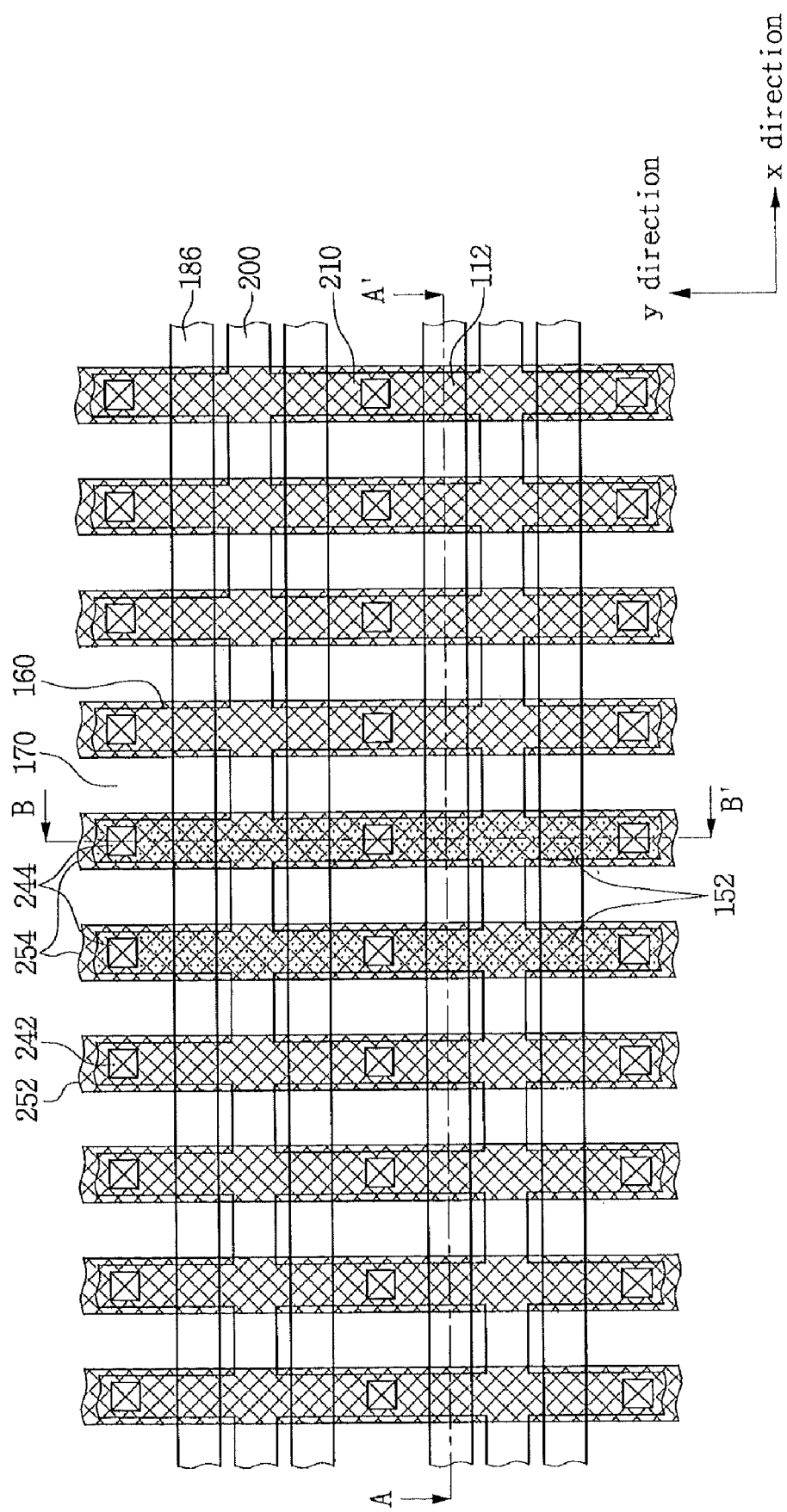
FIG. 1 illustrates the layout of an array of a metal contact of a NOR-type flash memory device according to example embodiments.

The present invention now will be described more fully hereinafter with reference to the accompanying drawings, in which various embodiments are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it can be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it can be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below. Also, the terms "horizontal" and "vertical," and the terms "x" and "y" are used herein to describe two generally orthogonal directions and do not imply a specific orientation.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2A:
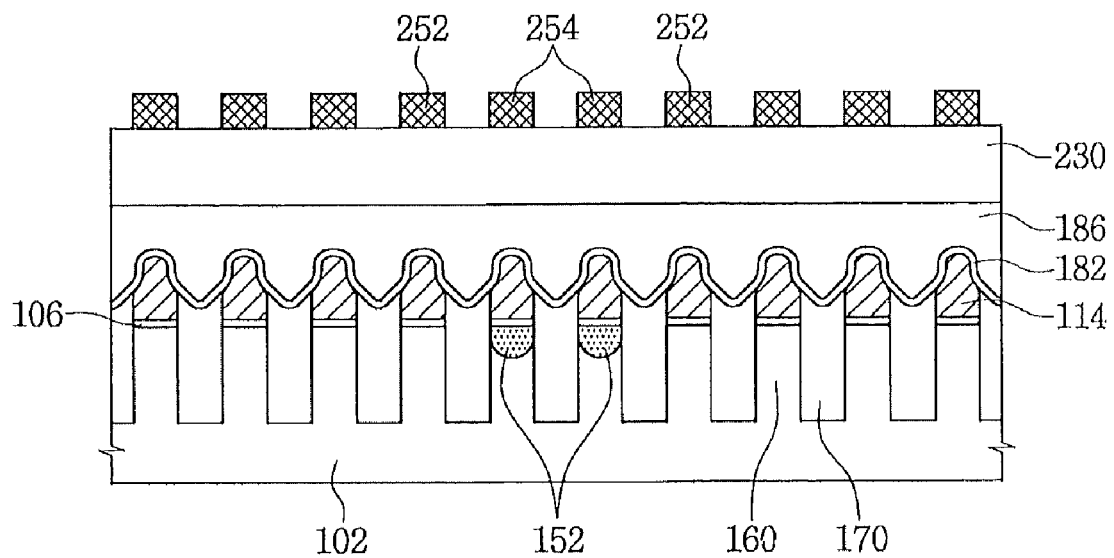
FIG. 2A is a longitudinal sectional view taken along line A-A' of FIG. 1.
Figure 2B:
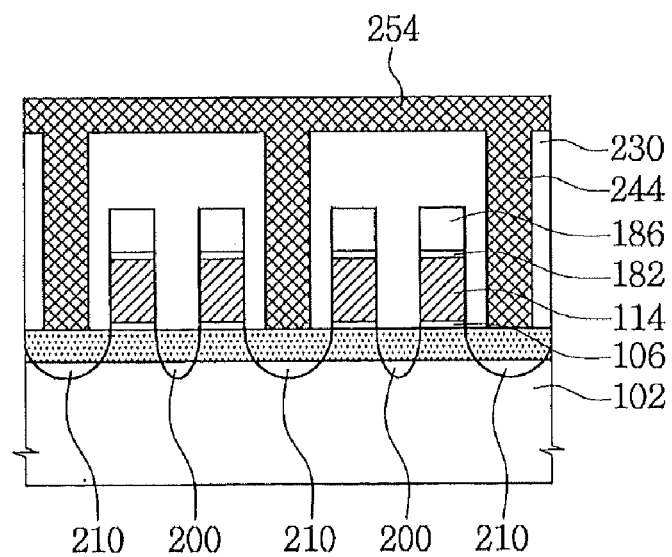
FIG. 2B is a longitudinal sectional view taken along line B-B' of FIG. 1.

FIG. 1 illustrates the layout of an array of a metal contact of a NOR-type flash memory device according to example embodiments, FIG. 2A is a longitudinal sectional view taken along line A-A' of FIG. 1, and FIG. 2B is a longitudinal sectional view taken along line B-B' of FIG. 1.

Referring to FIGS. 1, 2A, and 2B, a plurality of metal contacts 242 and 244 may be arrayed in a cell matrix shape. A plurality of active regions 160 may extend in a y direction on a substrate 102. Second conductive patterns 186 forming control gates may extend in an x direction on the substrate 102. Since the second conductive patterns 186 run over the active regions 160, the second conductive patterns 186 may intersect the active regions 160. Unit cells may be disposed at intersections between the second conductive patterns 186 and the active regions 160. First conductive patterns 112 forming floating gates may be independently formed at the intersections. Thus, the first conductive patterns 112 may be disposed between the second conductive patterns 186 and the active regions 160.

Drain regions 210 may be disposed in the active regions 160 on one side of the second conductive patterns 186. The drain regions 210 may be discontinuously arrayed in the x direction of FIG. 1. Common source regions 200 may be disposed in the active regions 160 on the other side of the second conductive patterns 186. The common source regions 200 forming source lines may be continuously disposed in the x direction of FIG. 1. One first conductive pattern 112, one second conductive pattern 186, one common source region 200, and one drain region 210 may constitute a single unit cell. A plurality of unit cells may be arrayed in the x and y directions to constitute a single cell array.

The plurality of metal contacts 242 and 244 may be disposed in the drain regions 210. The metal contacts 242 and 244 may include drain metal contacts 242 and source metal contacts 244. Thus, no metal contact may be disposed in the common source regions 200. The drain metal contacts 242 may be arrayed by eights, sixteens, or thirty-twos. Source metal contacts 244 may be further formed between the drain metal contacts 242 arrayed in the predetermined units. The source metal contacts 244 may be arrayed by twos or threes. The drain metal contacts 242 and the source metal contacts 244 may be arrayed in the same line. For example, the drain metal contacts 242 may be repetitively arrayed by sixteens, and the source metal contacts 244 may be repetitively arrayed by twos.

Bit lines 252 connected to the drain metal contacts 242 may extend in the y direction. Ground lines 254 connected to the source metal contacts 244 may extend in the y direction. The ground lines 254 may be repetitively arrayed between the bit lines 252 arrayed in predetermined units. For example, the bit lines 252 may be repetitively arrayed by sixteens, and the ground lines 254 may be repetitively arrayed by twos.

The source metal contacts 244 may be electrically connected to the common source regions 200 by impurity expansion regions 152. The impurity expansion regions 152 may always allow the flow of current from the common source regions 200 to the source metal contacts 244 so that a cell current may flow from the common source regions 200 to the source metal contacts 244. Thus, the source metal contacts 244 and the common source regions 200 may be connected by depletion transistors.

Hereinafter, methods of manufacturing NOR-type flash memory devices according to example embodiments will be described.

FIGS. 3A through 12A are longitudinal sectional views taken along line A-A' of FIG. 1, which illustrate a method of manufacturing a NOR-type flash memory device according to example embodiments, and FIGS. 3B through 12B are longitudinal sectional views taken along line B-B' of FIG. 1, which illustrate a method of manufacturing a NOR-type flash memory device according to example embodiments.

Figure 3A:
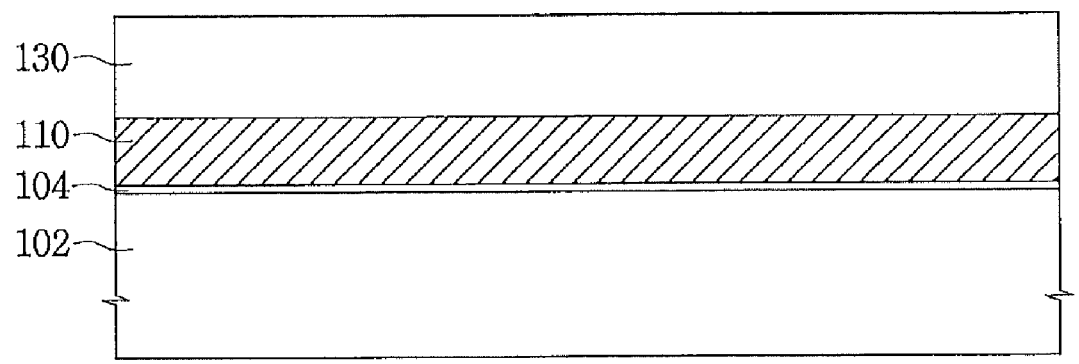
Figure 3B:
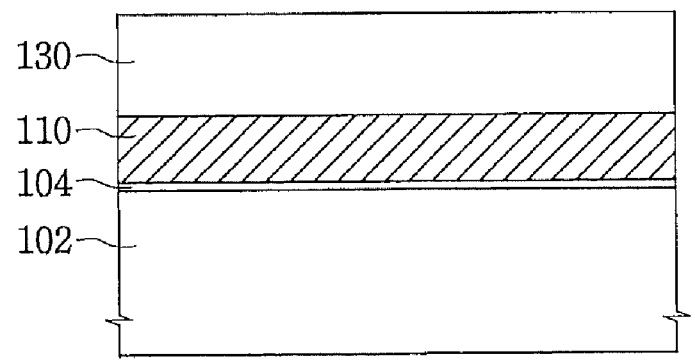

Referring to FIGS. 3A and 3B, a tunnel oxide layer 104 and a first conductive layer 110 may be deposited on a substrate 102, such as a semiconductor substrate, using a blanket deposition process. The tunnel oxide layer 104 may be a thermal oxide layer. The first conductive layer 110 may be formed of doped polysilicon (poly-Si). A first mask layer, such as a first hard mask layer 130, may be deposited on the first conductive layer 110. The first hard mask layer 130 may be a silicon nitride layer, a silicon oxide layer, or a silicon oxynitride layer. The first hard mask layer 130 may be formed to a thickness of about 200 to 300 Å to facilitate a patterning process. The first hard mask layer 130 may be a medium temperature oxide (MTO) layer. The MTO layer may be formed at a temperature of about 300 to 600° C. Also, the MTO layer may be obtained using a chemical vapor deposition (CVD) technique.

Figure 4A:
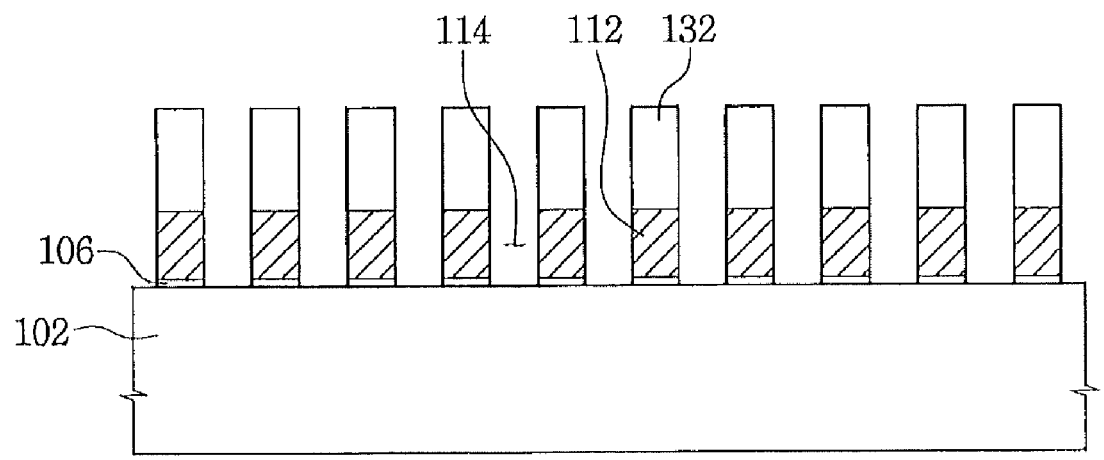
Figure 4B:
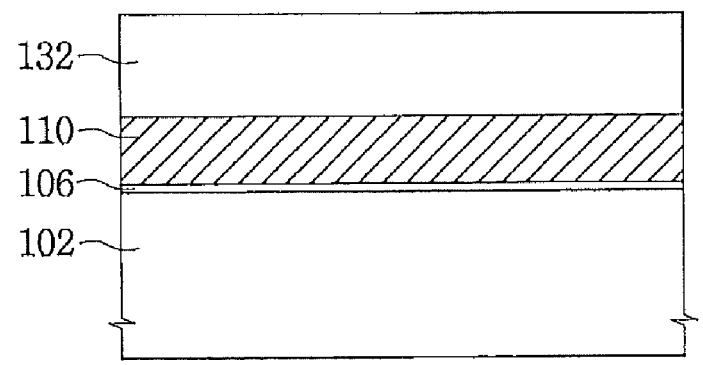

Referring to FIGS. 4A and 4B, the first hard mask layer 130 may be patterned using a photolithography process, thereby forming first mask patterns 132 extending in the y direction of FIG. 1. The first conductive layer 110 and the tunnel oxide layer 104 may be etched using the first mask patterns 132 as an etch mask, thereby forming first conductive patterns 112 and tunnel oxide patterns 106. The first conductive patterns 112 may serve as floating gates.

The first conductive patterns 112 may extend in the y direction of FIG. 1, and a plurality of first trenches 114 may be formed between adjacent ones of the first conductive patterns 112. The first conductive patterns 112 and the first trenches 114 may be formed as line-and-space (L/S) types. The line-type first conductive patterns 112 may correspond to active regions (refer to 160 in FIG. 1) of the substrate 102, and the space-type first trenches 114 may correspond to isolation layers (refer to 170 in FIG. 1) of the substrate 102. Thus, the surface of the substrate 102 may be exposed by the first trenches 114.

Figure 5A:
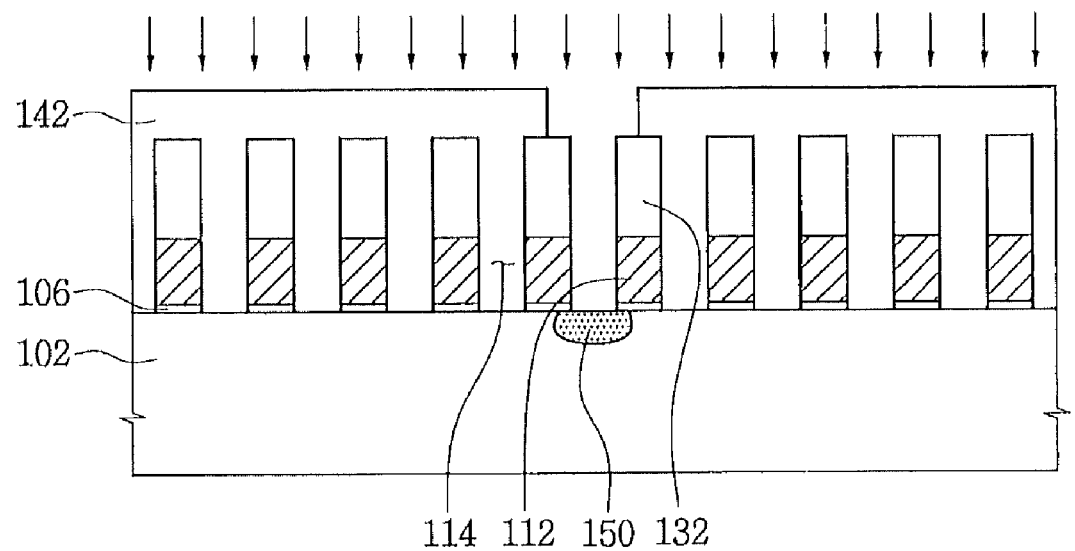
Figure 5B:
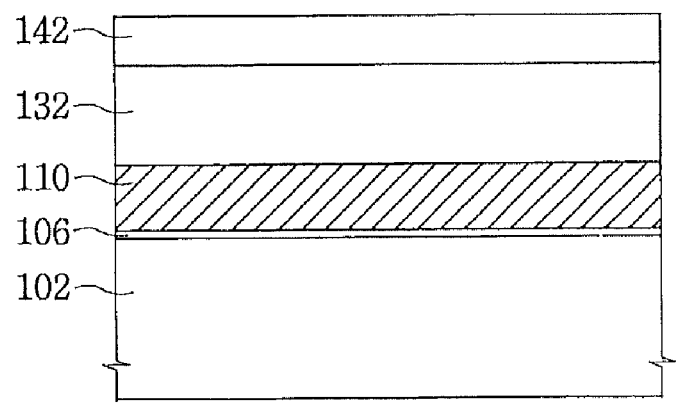

Referring to FIGS. 5A and 5B, a second mask pattern, such as a photoresist pattern 142, may be formed to open one of the first trenches 114. The opened first trench 114 may be formed in a region adjacent to a source metal contact (refer to 244 in FIG. 1). Thus, the photoresist pattern 142 may be opened in the y direction.

Impurity ions may be implanted into the substrate 102 using the photoresist pattern 142 as a first ion implantation mask. Only a region of the substrate 102 adjacent to the first trench 114 opened by the photoresist pattern 142 may be selectively doped with the impurity ions. An impurity region 150 extending in the y direction of FIG. 1 may be formed adjacent to the surface of the doped region of the substrate 102. After the ion implantation process is finished, the photoresist pattern 142 may be removed.

During the ion implantation process, a dopant (p-type dopant) of a Group III element and/or a dopant (n-type dopant) of a Group V element may be doped. The dopant of the Group III element may be one or more selected from the group consisting of boron (B), gallium (Ga) and indium (In). The dopant of the Group V element may be one or more selected out of phosphorus (P) and arsenic (As). When P or As is used, the ion implantation process may be carried out at an acceleration voltage of about 1 keV or higher and a dose of about $1E^{15}/cm^2$ or higher.

Figure 6A:
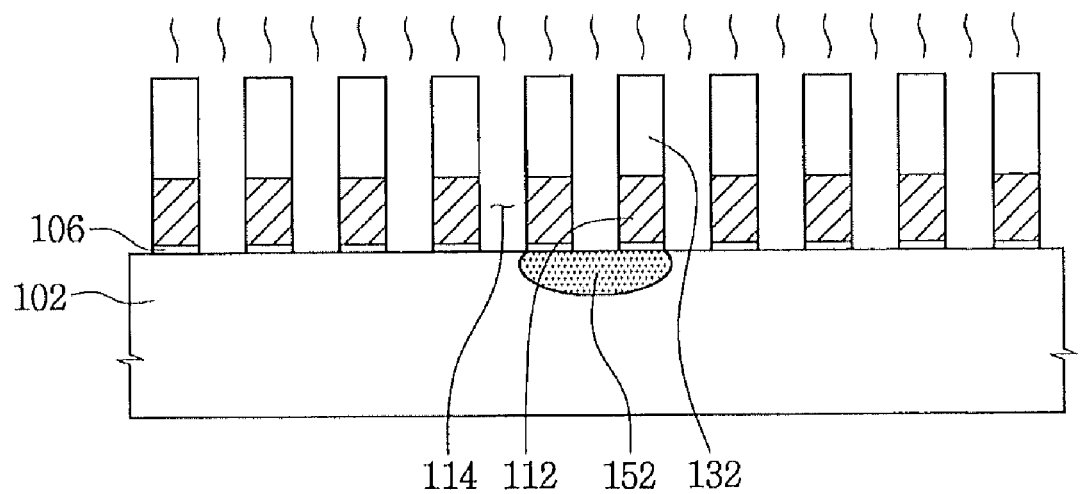
Figure 6B:
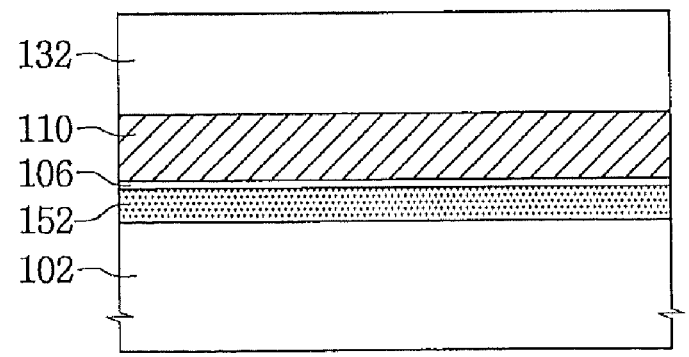

Referring to FIGS. 6A and 6B, the substrate 102 may be annealed. The annealing process may be performed to facilitate diffusion of impurities of the impurity region 150 to the vicinity of the opened first trench 114. Due to the diffusion of the impurities, the impurity region 150 may expand from the exposed region of the substrate 102 to an unexposed region thereof.

Due to the annealing process, an impurity expansion region 152 may be formed from the region of the substrate 102 exposed by the opened first trench 114 to the region of the substrate 102 covered with the first conductive pattern 112. The impurity expansion region 152 may expand in the x direction of FIG. 1 to the active regions (refer to 160 in FIG. 1) of the substrate 102 where the source metal contacts (refer to 244 in FIG. 1) are disposed.

The annealing process may be performed using a rapid thermal annealing (RTA) process and/or a furnace annealing process. The annealing process may be performed at a temperature of about 100° C. or higher.

Figure 7A:
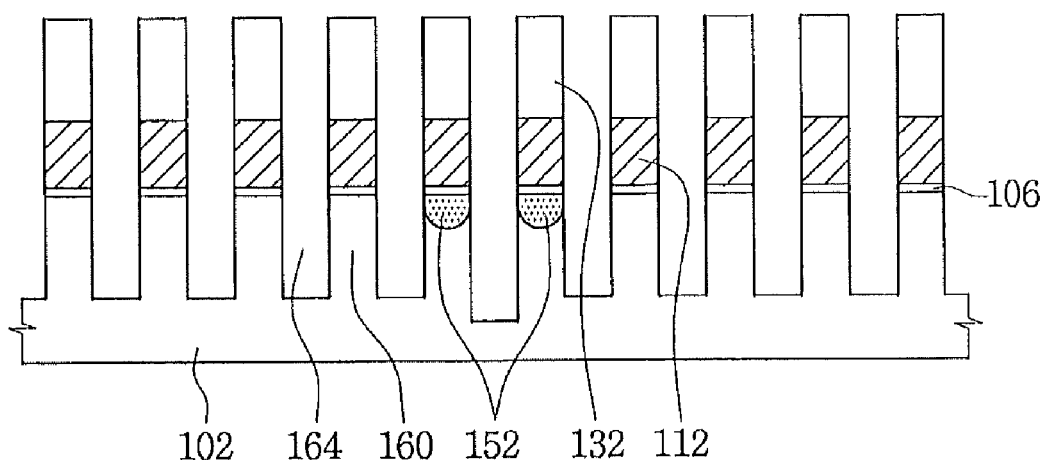
Figure 7B:
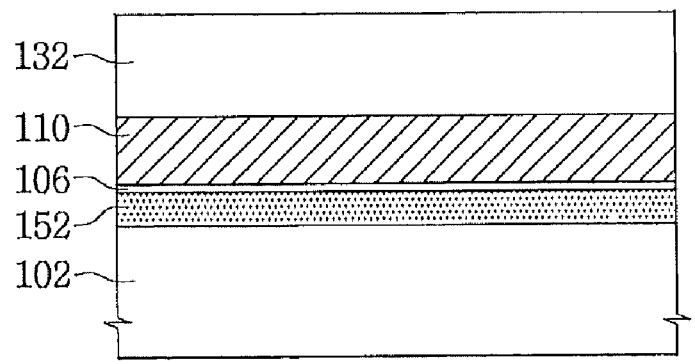

Referring to FIGS. 7A and 7B, the substrate 102 may be etched using the first mask patterns 132 as an etch mask. Second trenches 164 defining the active regions 160 may be formed to a predetermined depth in the substrate 102. Thus, the impurity expansion region 152 may be separated into two regions by the second trench 164. The first mask patterns 132 may be removed. In this case, since the region of the substrate 102 opened by the photoresist pattern 142 has sustained considerable shock during the ion implantation process, the second trench 164 separating the impurity expansion region 152 may become deeper than other second trenches 164 during the etching process.

Figure 8A:
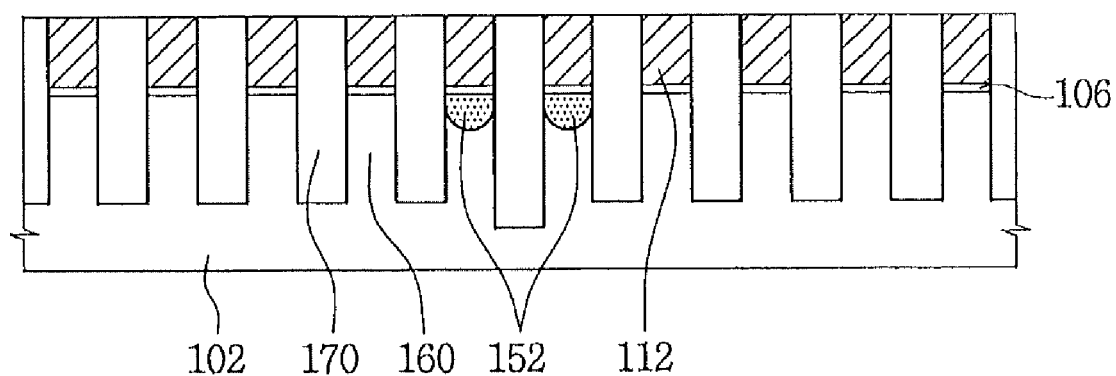
Figure 8B:
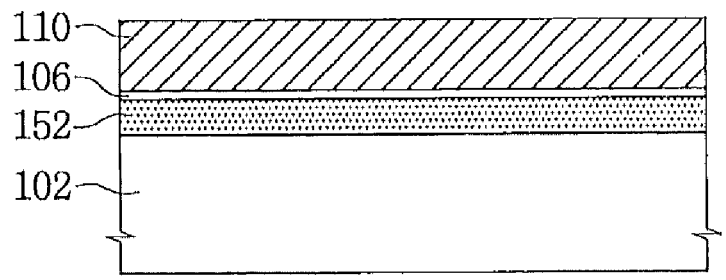

Referring to FIGS. 8A and 8B, a trench insulating material may be deposited to fill the first trenches 114 and the second trenches 164. The trench insulating material may be a high-density plasma (HDP) oxide. Although not shown in the drawings, the trench insulating material may fill the second trenches 164 and the first trenches 114 and be deposited even on the first conductive patterns 112. The trench insulating material may be planarized using a chemical mechanical polishing (CMP) process or an etchback process until the first conductive patterns 112 are exposed so that the trench insulating material can form a planar top surface with the first conductive patterns 112. In this case, the first mask patterns 132 may be removed together with the trench insulating material. Thus, isolation layers 170 defining the active regions 160 may be formed.

Figure 9A:
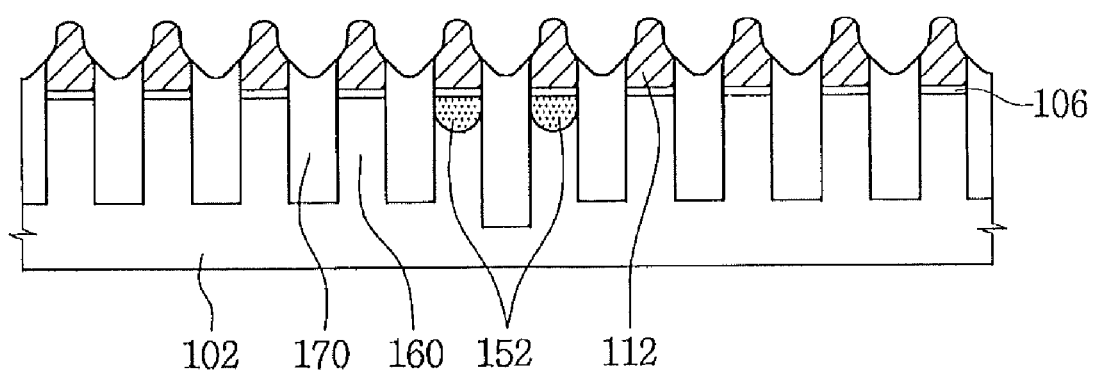
Figure 9B:
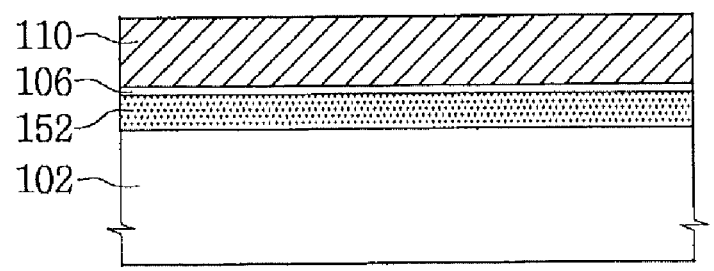

Referring to FIGS. 9A and 9B, the isolation layers 170 may be partially etched. The trench insulating material may be removed to expose lateral surfaces of the first conductive patterns 112.

Figure 10A:
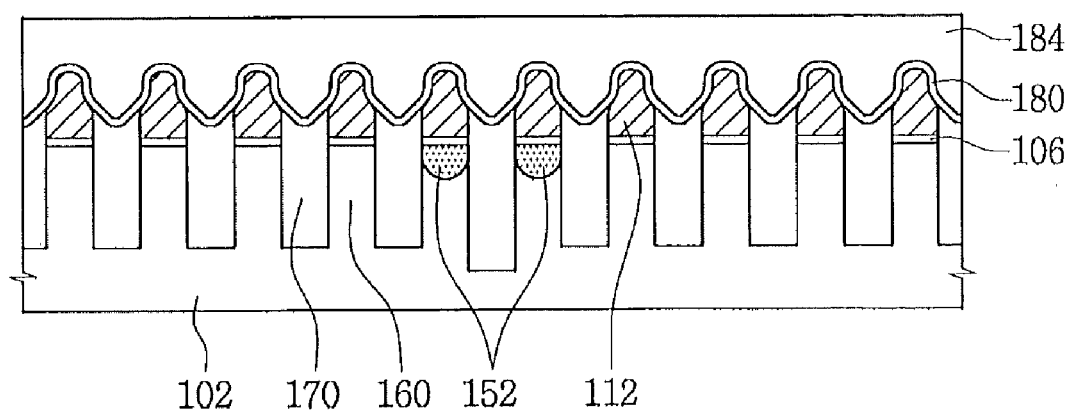
Figure 10B:
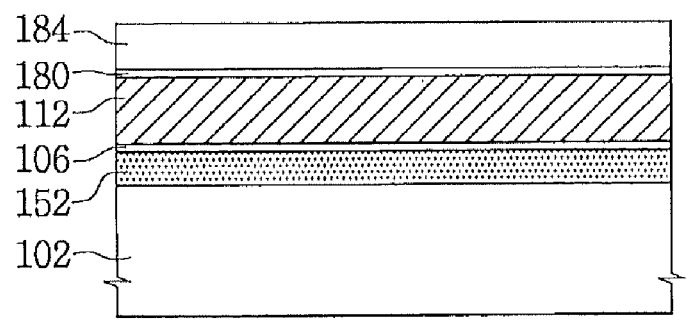

Referring to FIGS. 10A and 10B, a gate dielectric layer 180 may be formed on the first conductive patterns 112 and the isolation layers 170. The gate dielectric layer 180 may have a multilayered structure of a silicon oxide layer, a silicon nitride layer, and a silicon oxide layer. For example, the gate dielectric layer 180 may have an oxide-nitride-oxide (ONO: $SiO_2$/$Si_3N_3$/$SiO_2$) structure. Thereafter, a second conductive layer 184 may be deposited on the gate dielectric layer 180. The second conductive layer 184 may be formed of doped poly-Si.

Although not shown in the drawings, a silicide layer may be further deposited on the second conductive layer 184. The silicide layer may be formed of tungsten silicide ($WSi_x$). Also, a metal layer may be further formed on the silicide layer.

Figure 11A:
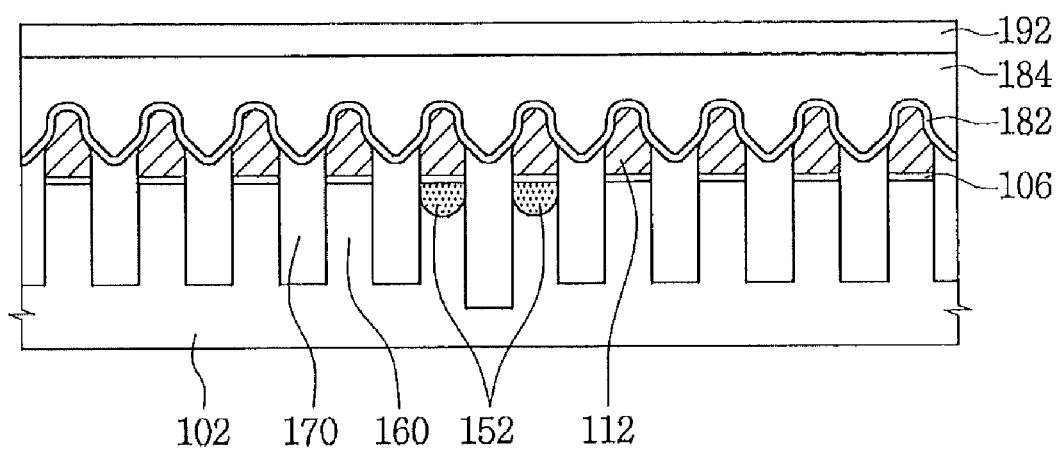
Figure 11B:
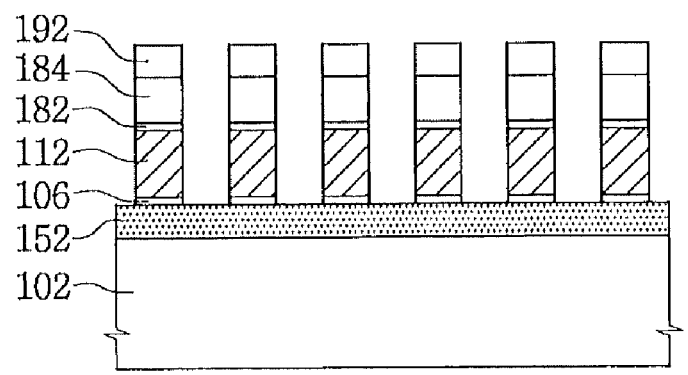

Referring to FIGS. 11A and 11B, third mask patterns, such as second hard mask patterns 192, extending in the x direction of FIG. 1 may be formed using a photolithography process. The second conductive layer 184, the gate dielectric layer 180, the first conductive pattern 112, and the tunnel oxide pattern 106 may be sequentially etched using the second hard mask patterns 192 as an etch mask to expose the active regions 160 and the isolation layers 170 of the substrate 102. Due to the etching process, tunnel oxide patterns 106, first conductive patterns 112, gate dielectric patterns 182, and second conductive patterns 186 may be formed. The second conductive patterns 186 may serve as control gates.

Thus, the tunnel oxide pattern 106 and the first conductive patterns 112 may be separated from one another in both the y and x directions of FIG. 1, while the second conductive patterns 186 and the gate dielectric patterns 182 may extend in the x direction and be separated from one another in the y direction. The tunnel oxide pattern 106, the first conductive pattern 112, the gate dielectric pattern 182, and the second conductive pattern 186 may constitute a stack gate.

Figure 12A:
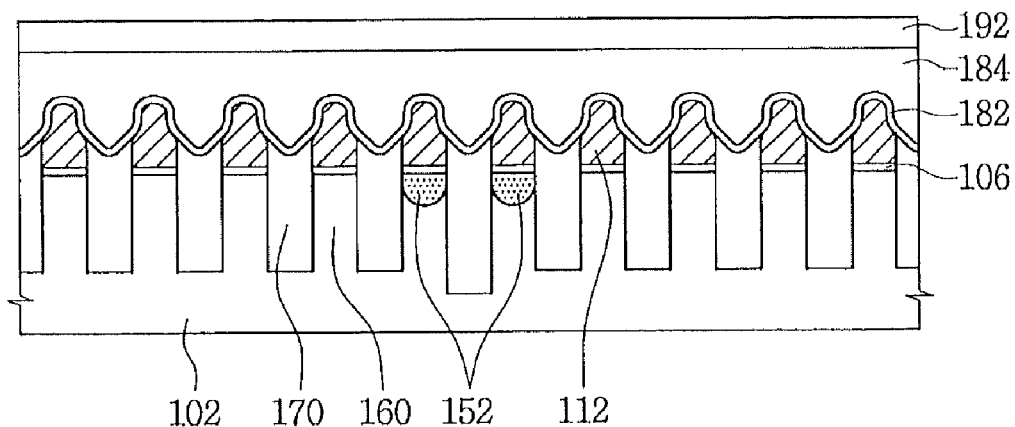
Figure 12B:
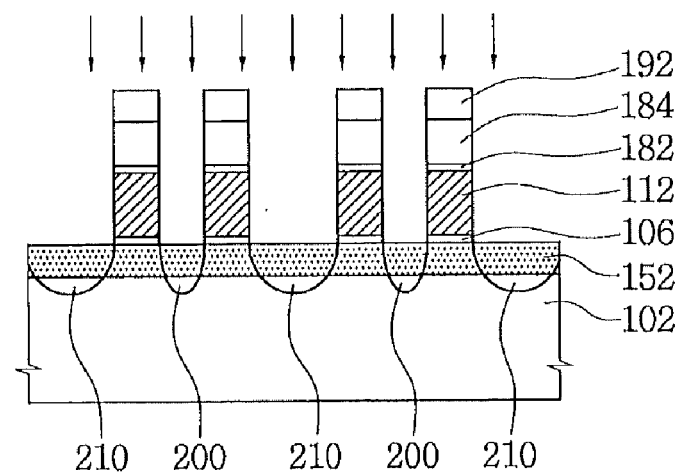

Referring to FIGS. 12A and 12B, a second ion implantation process may be performed on the exposed region of the substrate 102 having the second hard mask patterns 192. The second ion implantation process may be carried out using one or more dopants of a Group III element selected from the group consisting of boron (B), gallium (Ga) and indium (In). When impurity ions are implanted using the second hard mask patterns 192 as a second ion implantation mask, common source regions 200 may be formed in the exposed region of the substrate 102 on one side of the stack gate, while drain regions 210 may be formed in the exposed region of the substrate 102 on the other side of the stack gate.

In this case, the common source regions 200 may be formed using a self-aligned source (SAS) forming process. For example, the isolation layers 210 may be removed, and impurity ions may be implanted into regions from which the isolation layers 210 are removed, thereby forming SASs. The SASs may serve as common source lines. When the ion implantation process is finished, the second hard mask patterns 192 may be removed.

Referring back to FIGS. 1, 2A, and 2B, an interlayer insulating layer 230 may be deposited on the entire surface of the substrate 102. The interlayer insulating layer 230 may be formed of boron phosphorus silicate glass (BPSG) and/or phosphorus silicate glass (PSG). The interlayer insulating layer 230 corresponding to the drain regions 210 may be selectively etched, thereby forming drain contact holes (not shown) and source contact holes (not shown). The drain contact holes and the source contact holes may be filled with a conductive material, for example, tungsten (W). The conductive material may be planarized to form drain metal contacts 242 and source metal contacts 244 in the drain contact holes and the source contact holes, respectively. Thus, the drain metal contacts 242 and the source metal contacts 244 may be self-aligned so that 16 drain metal contacts 242 and 2 source metal contacts 244 can be repetitively formed.

A conductive material, for example, aluminum (Al), may be deposited again on the entire surface of the substrate 102. A metal interconnection process may be performed on the conductive material, so that bit lines 252 connected to the drain metal contacts 242 can be formed in the y direction of FIG. 1 and ground lines 254 connected to the source metal contacts 244 can be formed in the y direction of FIG. 1.

Figure 13:
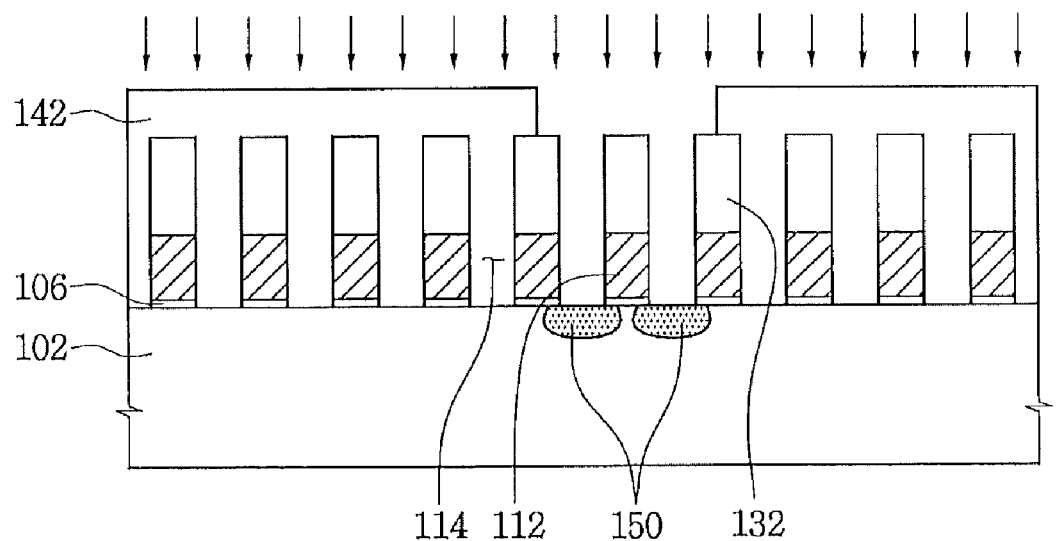
FIGS. 13 through 15 are longitudinal sectional views illustrating a method of manufacturing a NOR-type flash memory device according to example embodiments.
Figure 14:
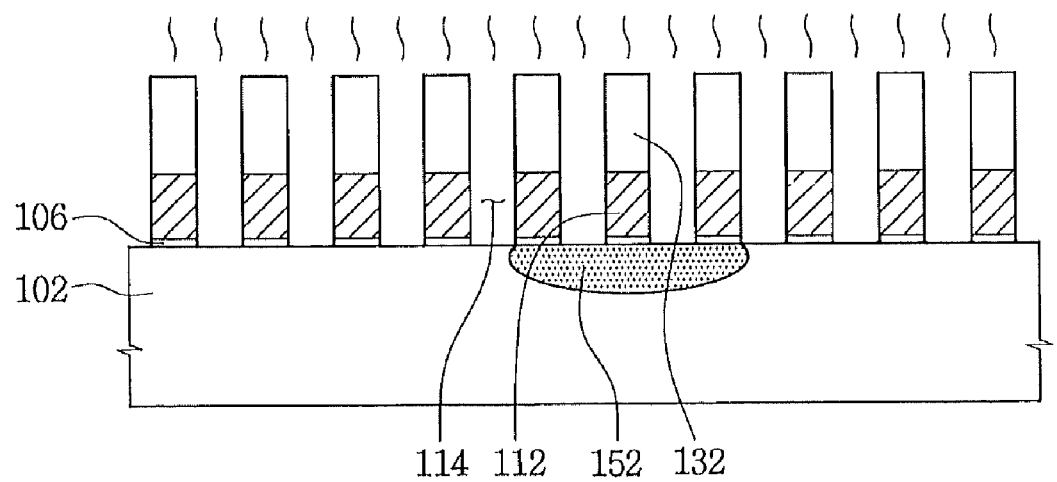
Figure 15:
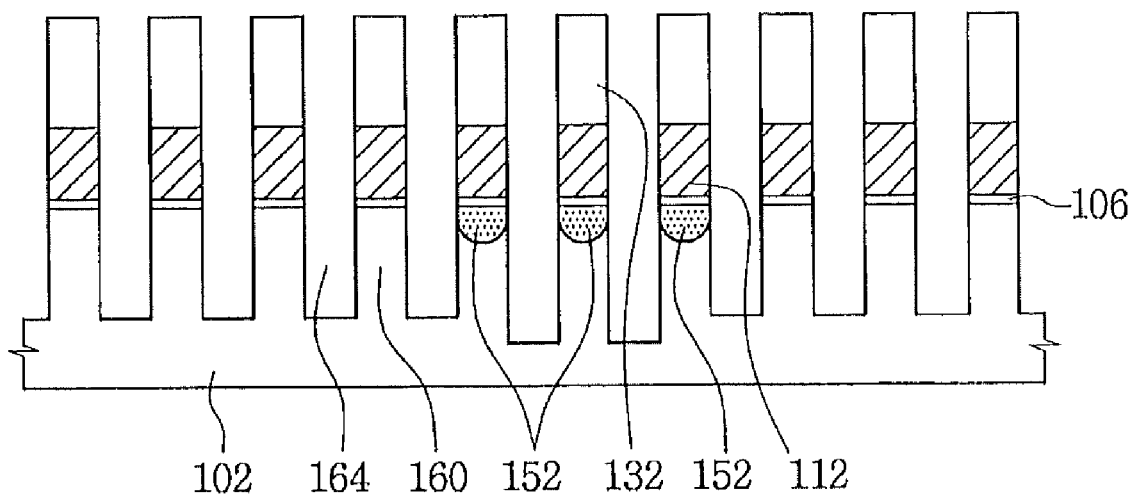

FIGS. 13 through 15 are longitudinal sectional views illustrating a method of manufacturing a NOR-type flash memory device according to example embodiments.

Referring to FIG. 13, a photoresist pattern 142 may be formed to open two of the first trenches 114. Impurity ions may be implanted into the substrate 102 using the photoresist pattern 142 as a first ion implantation mask so that only a region of the substrate 102 disposed adjacent to the opened two first trenches 114 can be selectively doped with impurity ions.

Referring to FIG. 14, the substrate 102 may be annealed. When the substrate 102 is annealed at a high temperature of about 100° C. or higher, impurities of the impurity region 150 may further diffuse to the vicinity of the opened two first trenches 114. Due to the diffusion of the impurity ions, an impurity expansion region 152 may be formed from the exposed region of the substrate 102 to an unexposed region thereof.

Referring to FIG. 15, the substrate 102 may be etched using the first mask patterns 132 as an etch mask, thereby forming second trenches 164 to define the active regions 160. In particular, the impurity expansion region 152 may be separated into three regions by two second trenches 164.

As explained thus far, methods of manufacturing a NOR-type flash memory device according to example embodiments may include implanting impurity ions using an ion implantation process and diffusing the impurity ions using an annealing process. Thus, even if poly-Si floating gates are formed, impurity regions may be formed under the poly-Si floating gates.

In addition, the names and functions of unshown or undescribed components may be easily understood with reference to other drawings of the present specification and descriptions thereof.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A method of manufacturing a NOR-type flash memory device, comprising:
    forming a tunnel oxide layer on a substrate;
    forming a first conductive layer on the tunnel oxide layer;
    forming first mask patterns parallel to one another on the first conductive layer in a y direction of the substrate;
    selectively removing the first conductive layer and the tunnel oxide layer using the first mask patterns as an etch mask, thereby forming first conductive patterns and tunnel oxide patterns, and forming first trenches exposing a surface of the substrate between the first conductive patterns and the tunnel oxide patterns;
    forming a second mask pattern to open at least one of the first trenches;
    implanting impurity ions using the second mask pattern as a first ion implantation mask, and forming an impurity region extending in the y direction of the substrate;
    removing the second mask pattern;
    annealing the substrate and diffusing the impurity region, thereby forming an impurity expansion region further expanding in an x direction of the substrate;
    selectively removing the substrate using the first mask patterns as an etch mask, and forming second trenches corresponding to the first trenches; and
    forming isolation layers defining active regions in the second trenches.

2. The method of claim 1, wherein the first conductive patterns and the first trenches are formed as line-and-space (L/S) types.

3. The method of claim 1, wherein the impurity expansion region is divided into at least two regions by the second trench.

4. The method of claim 1, wherein implanting the impurity ions is performed using phosphorus (P) and/or arsenic (As) as a dopant, and the dopant is implanted at an energy of at least about 1 keV and a dose of at least about $1E^{15}/cm^2$.

5. The method of claim 1, wherein annealing the substrate is performed to diffuse the impurity ions of the impurity region from the opened first trench to the vicinity of the opened first trench.

6. The method of claim 5, wherein the impurity region is formed as a depletion type, and diffusing the impurity ions of the impurity region comprises expanding the impurity ions of the impurity region to the active region to allow a cell current to flow through the active region.

7. The method of claim 1, wherein forming the isolation layers defining active regions in the second trenches comprises:
    removing the first mask patterns;
    depositing a trench insulating material on the first conductive patterns to overfill the first and second trenches;
    planarizing the trench insulating material until the trench insulating material forms a planar top surface with the first conductive patterns; and
    partially removing the trench insulating material until lateral surfaces of the first conductive patterns are exposed.

8. The method of claim 1, further comprising:
    forming a gate dielectric layer on the first conductive patterns and the isolation layers;
    forming a second conductive layer on the gate dielectric layer;
    forming a third mask layer on the second conductive layer and forming a plurality of third mask patterns extending in the x direction;
    selectively removing the second conductive layer, the gate dielectric layer, the first conductive patterns, and the tunnel oxide patterns using the third mask patterns as an etch mask to form second conductive patterns, gate dielectric patterns, first conductive patterns, and tunnel oxide patterns, wherein the tunnel oxide patterns, the first conductive patterns, the gate dielectric patterns, and the second conductive patterns constitute gate structures, and third trenches exposing the surface of the substrate are formed between the gate structures;
    implanting impurity ions using the third mask patterns as a second ion implantation mask to form common source regions in an exposed region of the substrate on one side of the gate structures and form drain regions in the exposed region of the substrate on the other side of the gate structures;
    removing the third mask patterns;
    depositing an interlayer insulating layer to cover the gate structures and selectively etching portions of the interlayer insulating layer corresponding to the drain regions to form drain contact holes and source contact holes, respectively;
    filling the drain contact holes and the source contact holes with a conductive material to form drain metal contacts and source metal contacts in the drain contact holes and the source contact holes, respectively; and
    forming a metal interconnection layer on the interlayer insulating layer to form bit lines connected to the drain metal contacts in the y direction and form ground lines connected to the source metal contacts in the y direction.

9. The method of claim 8, wherein sixteen drain metal contacts and two source metal contacts are alternately formed.

10. The method of claim 8, wherein the first trench opened by the second mask pattern corresponds to one isolation layer defining the active region where the source metal contact is formed.

11. A method of manufacturing a NOR-type flash memory device, comprising:
    forming first mask patterns as line-and-space (L/S) types on a substrate having a first conductive layer;

etching the first conductive layer using the first mask patterns as an etch mask, and forming first trenches defining first conductive patterns;

forming a second mask pattern to open at least one of the first trenches;

implanting first impurity ions into the substrate using the second mask pattern as an ion implantation mask;

diffusing the first impurity ions using an annealing process to form an impurity expansion region;

etching the substrate using the first mask patterns as an etch mask, forming second trenches defining active regions, and separating the impurity expansion region into at least two regions by the second trench;

forming isolation layers in the second trenches;

depositing a gate dielectric layer and a second conductive layer on the first conductive patterns;

forming third mask patterns as L/S types in an orthogonal direction to the first mask patterns;

etching the second conductive layer and the gate dielectric layer using the third mask patterns as an etch mask, and forming first conductive patterns, gate dielectric patterns, and second conductive patterns;

implanting second impurity ions using the third mask patterns as an ion implantation mask, thereby forming common source regions on one side of the second conductive patterns, and forming drain regions on the other side of the second conductive patterns; and removing the third mask patterns, depositing an interlayer insulating layer on the second conductive patterns, and vertically forming drain metal contacts and source metal contacts in portions of the interlayer insulating layer corresponding to the drain regions.

12. The method of claim 11, wherein two first trenches are opened by the second mask pattern, and the impurity expansion region is separated into three regions by the second trenches.

13. The method of claim 11, further comprising forming bit lines and ground lines on the interlayer insulating layer to be connected to the drain metal contacts and the source metal contacts, respectively,
wherein sixteen bit lines and two ground lines are alternately formed.

14. The method of claim 11, wherein the first and second conductive layers are formed of doped polysilicon (poly-Si), the first conductive patterns are used as floating gates, and the second conductive patterns are used as control gates.

15. The method of claim 11, wherein the first mask patterns are formed of a medium temperature oxide (MTO) layer to a thickness of about 200 to 300 Å.

16. The method of claim 11, wherein diffusing the first impurity ions comprises expanding impurity ions of the impurity region from the opened first trench to the active regions disposed adjacent to the opened first trench on both sides of the opened first trench.

17. A method of manufacturing a NOR-flash memory device, comprising:

forming first mask patterns as line-and-space (L/S) types on a substrate on which a first polysilicon (poly-Si) layer is stacked, line-type first mask patterns corresponding to active regions to be formed on the substrate, and space-type first mask patterns corresponding to isolation layers to be formed on the substrate;

etching the first poly-Si layer using the first mask patterns as an etch mask until the substrate is exposed, and forming first poly-Si patterns defined by first trenches;

forming a second mask pattern to open one or two of the first trenches;

implanting impurity ions into a region of the substrate exposed by the one or two first trenches using the second mask pattern, and forming an impurity region in the exposed region of the substrate;

annealing the substrate at a predetermined temperature and diffusing the impurity region from the exposed region of the substrate to an unexposed region thereof, thereby forming an impurity expansion region expanding to the active regions of the substrate;

etching the substrate to a predetermined depth using the first mask patterns, and forming second trenches extending downward from the first trenches, the second trenches being configured to separate the impurity expansion region into two or three regions;

forming the isolation layers to fill at least the second trenches and isolate the active regions from the first conductive patterns;

forming an oxide-nitride-oxide (ONO) pattern and a second poly-Si pattern to extend in an orthogonal direction to the first poly-Si pattern, continuously forming common source regions on one side of the second poly-Si patterns in the direction in which the second poly-Si patterns extend, and discontinuously forming drain regions on the other side of the second poly-Si patterns in the direction in which the second poly-Si patterns extend;

repetitively aligning drain metal contacts and source metal contacts in the drain regions, the common source regions being electrically connected to the source metal contacts of the drain regions by the impurity expansion region running under the first poly-Si layer.

18. The method of claim 17, wherein annealing the substrate is performed using a rapid thermal annealing (RTA) process or a furnace annealing process at a high temperature of at least about 100° C.

19. The method of claim 17, wherein the drain metal contacts are repetitively arrayed by eights, sixteens, or thirty-twos, and the source metal contacts are repetitively arrayed by twos or threes.

20. The method of claim 17, wherein the impurity region is formed as a depletion type, functions as a channel, and remains turned on.

* * * * *